United States Patent
Stanton et al.

(10) Patent No.: US 7,273,684 B2
(45) Date of Patent: Sep. 25, 2007

(54) MASK HAVING TRANSMISSIVE ELEMENTS AND A COMMON SIDELOBE INHIBITOR FOR SIDELOBE SUPPRESSION IN RADIATED PATTERNING

(75) Inventors: William A. Stanton, Boise, ID (US); Husayn Alvarez-Gomariz, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/336,229

(22) Filed: Jan. 20, 2006

(65) Prior Publication Data
US 2006/0115748 A1 Jun. 1, 2006

Related U.S. Application Data

(62) Division of application No. 10/609,097, filed on Jun. 27, 2003.

(51) Int. Cl.
*G03F 1/00* (2006.01)
(52) U.S. Cl. .......................................... 430/5
(58) Field of Classification Search ............ 430/5
See application file for complete search history.

(56) References Cited

U.S. PATENT DOCUMENTS 5,700,601 A * 12/1997 Hasegawa et al. ............ 430/5
5,700,606 A * 12/1997 Kobayashi et al. ............ 430/5
5,795,682 A 8/1998 Garza
6,258,489 B1 7/2001 Stanton et al.
6,291,113 B1 9/2001 Spence
6,383,691 B1 5/2002 Seitz et al.
6,413,684 B1 7/2002 Stanton
6,465,138 B1 10/2002 Stanton
6,807,519 B2 * 10/2004 Stanton ........................ 703/2
2005/0049839 A1 * 3/2005 Stanton ........................ 703/2

* cited by examiner

*Primary Examiner*—Mark F. Huff
*Assistant Examiner*—John Ruggles
(74) *Attorney, Agent, or Firm*—TraskBritt, PC (57) ABSTRACT

A mask having transmissive elements and one or more sidelobe inhibitors for sidelobe suppression during a radiation-patterning process is provided. Sidelobe artifacts are mitigated by identifying elements as a function of the radiation wavelength for forming desired profiles on a semiconductor wafer. A diffraction rings is calculated around each of the elements to identify sidelobe interference zones and intersections of diffraction rings are located. When a guard ring around one of the intersections Sidelobe inhibitor is located at the a common sidelobe common overlap region of the guard rings. A method for forming a mask with the addition of sidelobe inhibitors as well as a method for determining the location of placement of sidelobe inhibitors is also disclosed.

10 Claims, 11 Drawing Sheets

MASK HAVING TRANSMISSIVE ELEMENTS AND A COMMON SIDELOBE INHIBITOR FOR SIDELOBE SUPPRESSION IN RADIATED PATTERNING

CROSS-REFERENCE TO RELATED APPLICATION

This application is a divisional of application Ser. No. 10/609,097, filed Jun. 27, 2003, pending.

BACKGROUND OF THE INVENTION

1. Field of the Invention

The present invention relates to the field of semiconductor fabrication and, more particularly, to a mask for use in a photolithography process employed during semiconductor fabrication.

2. State of the Art

Photolithography is commonly used during the fabrication of integrated circuits on semiconductor wafers and other bulk substrates comprising a layer of semiconductor material. During photolithography, a form of radiant energy is passed through a radiation-patterning tool onto a radiation-sensitive material, commonly referred to as photoresist, which is placed upon a surface of a semiconductor wafer. The radiation-patterning tool is commonly known as a photomask or reticle. The term "photomask" is used to reference a structure that performs a function of masking or defining a pattern over an entire semiconductor wafer while the term "reticle" is used to reference a structure that functions to define a pattern over a portion of a wafer.

Radiation-patterning tools contain light-restrictive regions and light-transmissive regions. Light-restrictive regions may be, for example, opaque or partially light transmissive. The light-transmissive regions or portions of a radiation-patterning tool, in conjunction with the light-restrictive regions, cooperatively facilitate the formation of a desired pattern on a semiconductor wafer. For the formation of patterns on a semiconductor wafer, the wafer is coated with a layer of radiation-sensitive material (e.g., photoresist). Subsequently, radiation passes through the radiation-patterning tool onto the layer of photoresist and transfers onto the photoresist a pattern defined by the radiation-patterning tool. Using a form of a photographic process, the photoresist is then developed to remove either the portions exposed to the radiant energy in the case of a "positive" photoresist or the unexposed portions when a "negative" photoresist is utilized. The residual photoresist pattern thereafter serves as a mask for a subsequent semiconductor fabrication process.

With advances in semiconductor integrated circuit processes, the dimensions associated with integrated circuit device features have decreased. Furthermore, the demand for smaller and faster-performing semiconductor devices requires increasing precision and accuracy in photolithographic processes.

Figure 1:
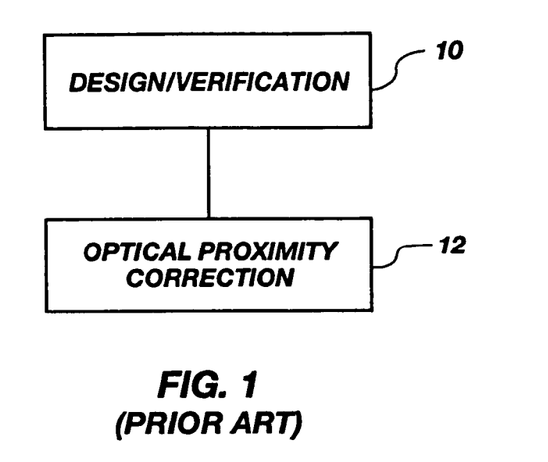
FIG. 1 is a flow chart of a prior art method of forming a radiation-patterning tool.

FIG. 1 illustrates a flow chart of a conventional process used for creating a pattern for a radiation-patterning tool. Initially, a preliminary design is created and verified 10 with the desired pattern identified to form the desired pattern on the target photoresist. Subsequently, profiles are developed for the radiation-patterning tool to roughly produce the desired pattern when radiation is passed through the radiation-patterning tool. The profiles or elements form a rough correspondence to the desired pattern as the profiles or elements initially disregard the effects of interference of radiation passing through the radiation-patterning tool.

Following creation and verification of the design, optical proximity correction 12 accounts for various interference factors that influence radiation passing through the radiation-patterning tool. Such interference factors may include constructive and destructive interference effects resulting as the radiation wavelength approximates the dimensions of portions of the profiles or elements of the radiation-patterning tool. Optical proximity correction modifies the profile or element dimensions to shapes such that a resultant patterned photoresist more closely approximates the desired pattern. The processes of designing, verifying and optically correcting a design are typically accomplished primarily through the use of software, such as is available from Synopsys Corporation of Mountain View, Calif.

As a result of the optical proximity correction process 12, a data set that corresponds to a pattern capable of generation by a radiation-patterning tool is typically generated. The data set is subsequently "taped out" to a radiation-patterning tool through the use of, for example, laser writing and/or electron-beam writing methodologies. Following the formation of the pattern on the radiation-patterning tool, the tool is capable of being utilized for semiconductor fabrication.

Figure 2:
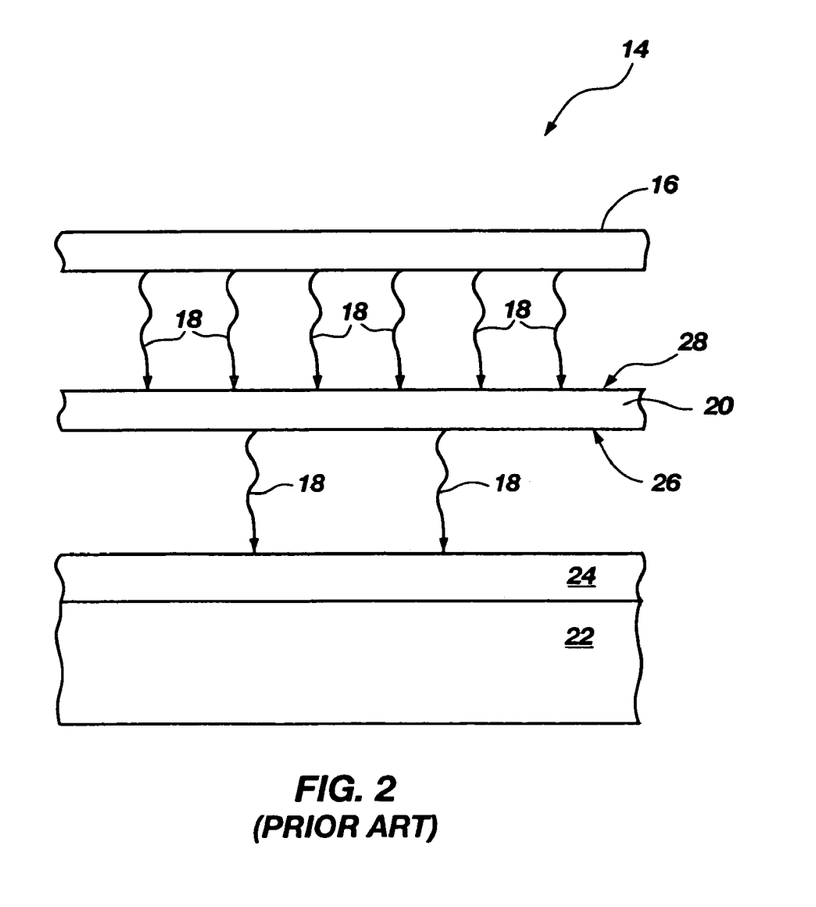
FIG. 2 is a cross-sectional view of a prior art apparatus utilized in printing a pattern on a radiation-sensitive material utilizing a radiation-patterning tool.

FIG. 2 illustrates an exemplary apparatus 14 in which a radiation-patterning tool is utilized for a patterning process. Apparatus 14 comprises a radiation source 16 that generates radiation 18 and further includes a radiation-patterning tool 20 through which radiation 18 is passed. A semiconductor wafer or substrate 22 includes a radiation-sensitive layer 24 thereon. As illustrated, radiation 18 passes through radiation-patterning tool 20 and impacts radiation-sensitive layer 24 to form a pattern. This process of forming a pattern on a radiation-sensitive material with a radiation-patterning tool is commonly referred to as a printing process.

A radiation-patterning tool 20 typically includes an obscuring material that may either be an opaque (e.g., chrome) or a semi-opaque material placed over a transparent material (e.g., glass). Radiation-patterning tool 20 is illustrated in FIG. 2 as having a front side 28 for forming features or windows and an opposing back side 26. Some radiation-patterning tools further utilize both the front side and back side for the formation of windows.

Figure 3:
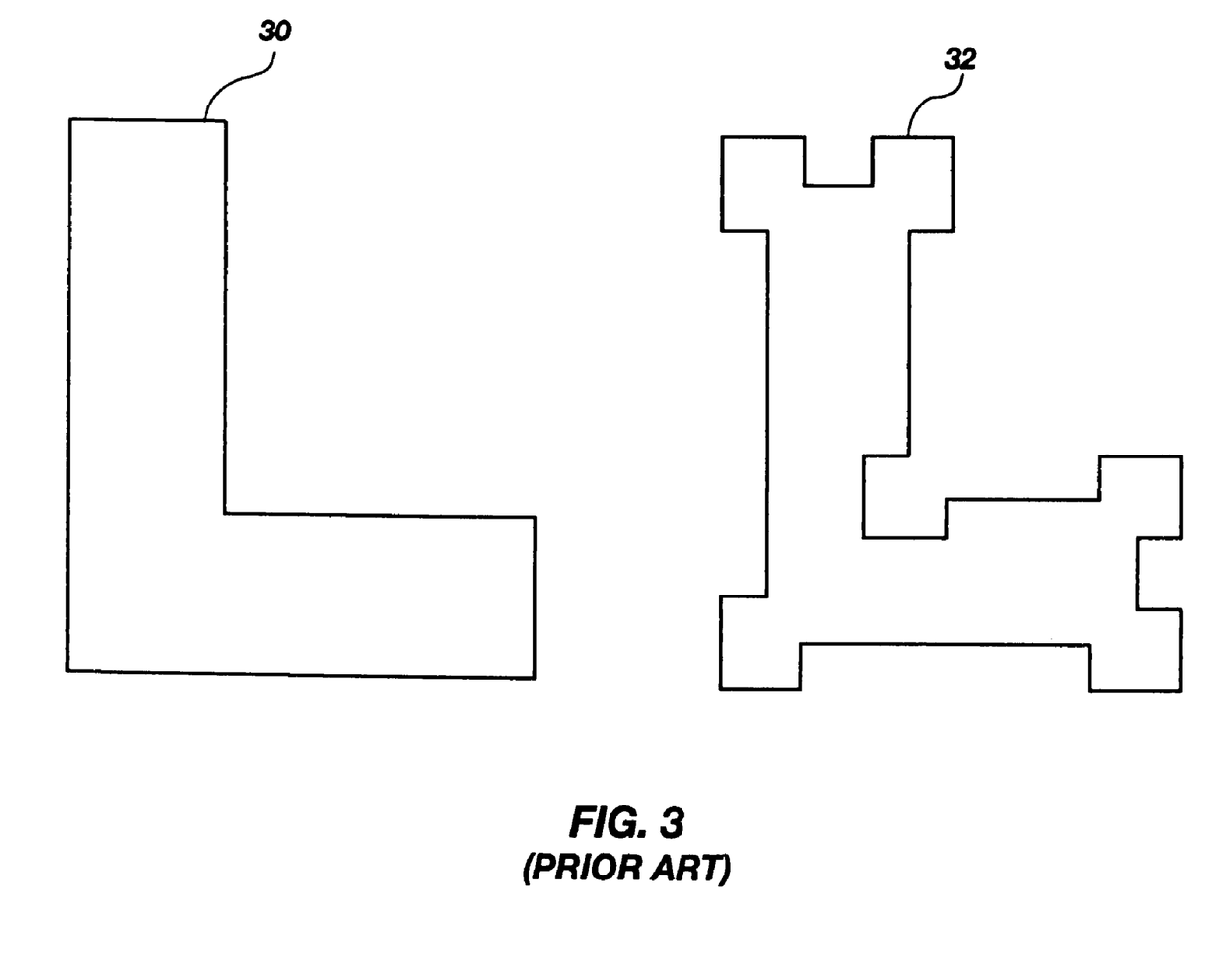
FIG. 3 is a view of a desired prior art pattern and a prior art element utilized for producing the pattern.

Radiation-patterning tool 20 typically has a pattern with dimensions on the order of, or smaller than, the wavelength of radiation passing through the radiation-patterning tool. Therefore, interference effects may occur when radiation passes through the radiation-patterning tool and exits onto the radiation-sensitive material. Accordingly, the pattern of the radiation-patterning tool must be modified to compensate for such interference effects. FIG. 3 illustrates an exemplary pattern 30 desired to be formed on the radiation-sensitive material by subsequent semiconductor processes. Due to the interference effects, pattern 30 cannot be directly utilized but must undergo the optical proximity correction 12 of FIG. 1. Pattern 32 illustrates a corrected pattern that accommodates the interference effects resulting from near-wavelength dimension patterns.

Figure 4:
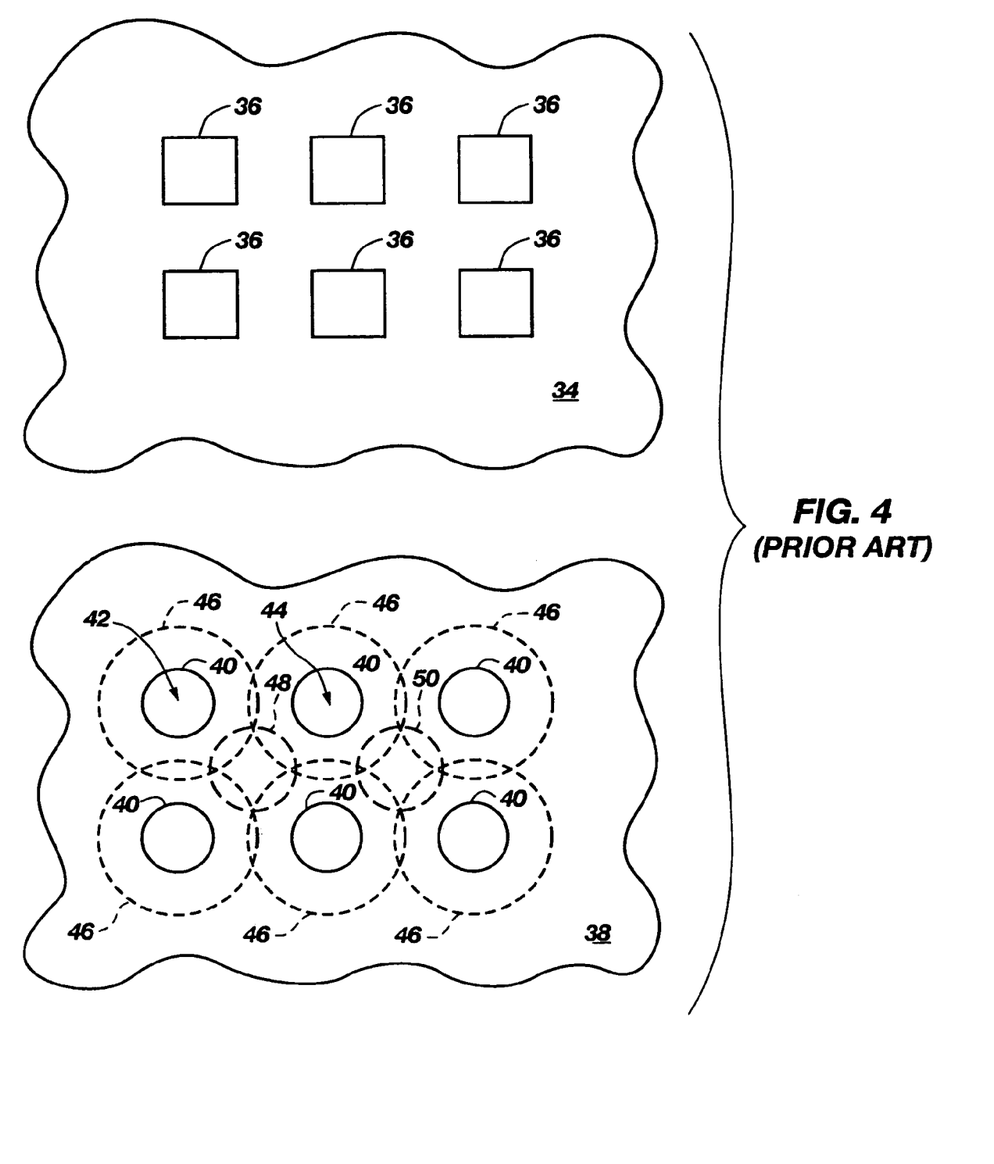
FIG. 4 is a top view of a prior art pattern in a radiation-sensitive material together with a top view of a prior art radiation-patterning tool utilized for forming the pattern.

FIG. 4 illustrates a radiation-patterning tool 34 and further illustrates elements utilized to create the targeted or printed images. In the exemplary printing process, a radiation-sensitive material 38 is illustrated as having formed therein a plurality of repeating patterns 40, illustrated as circular in dimension, which may be used, for example, in the formation of contact openings. One of the patterns 40 is illustrated as being centered around a location 42 while another one of the repeating patterns is illustrated as being centered around a location 44. Still referring to FIG. 4, radiation-patterning tool 34 includes a plurality of repeating elements 36 that are in a one-to-one correspondence with patterns 40 formed on the radiation-sensitive material 38. As shown, each of elements 36 is approximately square in shape that when passing radiation therethrough, forms the circular patterns 40 on radiation-sensitive material 38. Elements 36 on the radiation-patterning tool 34 may be either more transparent to radiation than surrounding regions or less transparent, depending on whether the radiation-sensitive material 38 is implemented as a positive or negative photoresist material. When elements 36 are more transmissive to radiation than surrounding regions, elements 36 effectively act as windows that allow radiation to pass through onto the radiation-sensitive material 38.

The printed patterns 40 correspond to regions where light has passed through elements 36 of the radiation-patterning tool 34. As described above, when elements 36 exhibit dimensions approximating the wavelength of the radiation, interference effects may occur. FIG. 4 illustrates interference effects in the form of sidelobes 46 extending around each of the patterns 40. Exposure of radiation-sensitive material 38 to a single sidelobe 46 generally does not result in a printed feature within the radiation-sensitive material 38. However, when two or more sidelobes 46 overlap, it is possible to form a printed feature. Regions 48 and 50 illustrate locations where, specifically, four sidelobes converge, and accordingly illustrate locations where printed features may be undesirably manifested.

Figure 5:
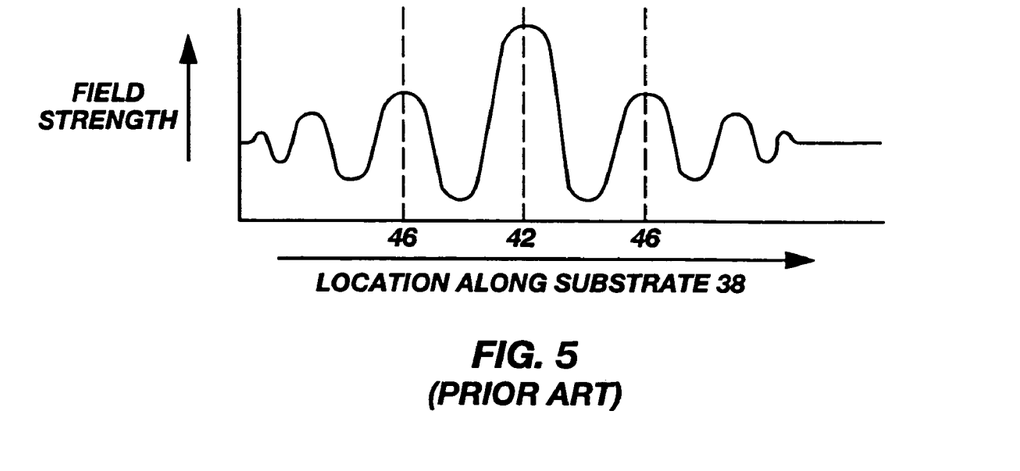
FIG. 5 is a graphical illustration of radiation field strength across a substrate of an electrical field associated with radiation passing through a prior art radiation-patterning tool.
Figure 6:
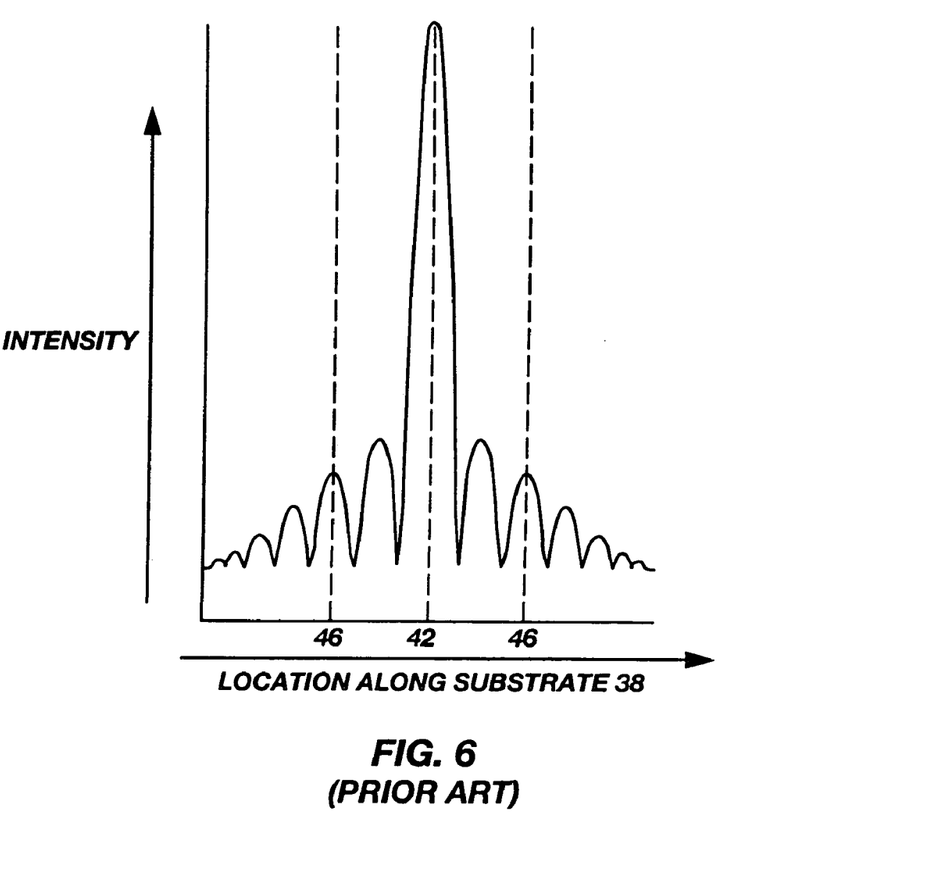
FIG. 6 is a graphical illustration of radiation intensity across a substrate of an electrical field associated with radiation passing through a prior art radiation-patterning tool.
Figure 7:
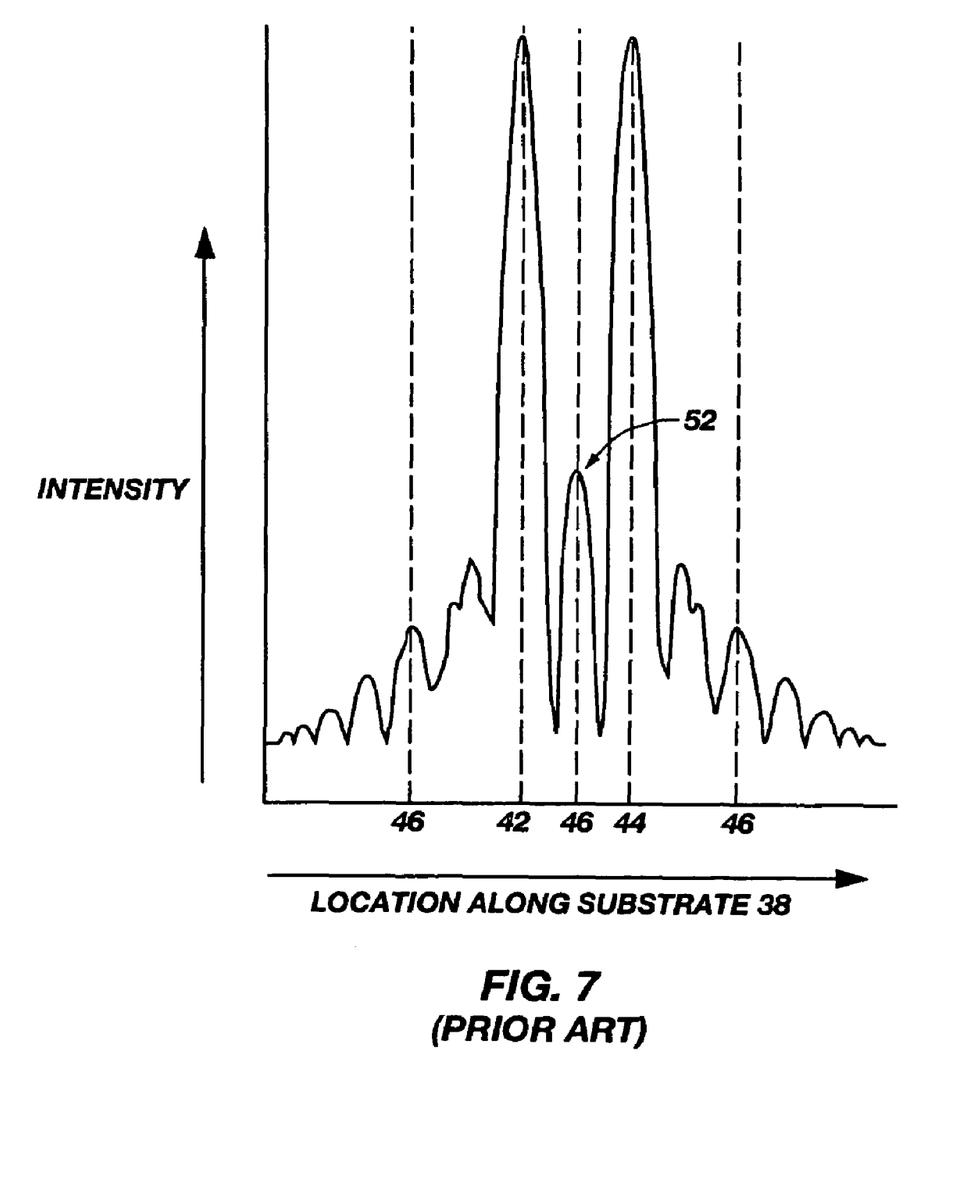
FIG. 7 is a graphical illustration of radiation intensity across a substrate and further illustrates a combination of intensities from two combining fields passing through a prior art radiation-patterning tool.

FIGS. 5-7 further describe sidelobe convergence in additional detail with respect to the interference effects of radiation having a wavelength that is on the order of the dimensions of the desired pattern. In FIG. 5, the electric field strength of radiation passing through an element 36 (FIG. 4) is diagrammatically illustrated for forming a pattern 40 (FIG. 4) centered around a location 42. As illustrated, a large, positive field strength occurs at location 42, which creates undesirable sidelobes 46. A large, positive field strength centered around location 42 may be referred to as a primary lobe while the lobes or concentrations of energy centered away from the primary lobe are referred to as sidelobes 46.

The exposure of radiation-sensitive material 38 is proportional to the intensity of the radiation rather than the field strength, as the intensity is a function of the square of the field strength. FIG. 6 illustrates the intensity of the radiation utilized to pattern the feature centered around location 42. Accordingly, since the intensity is the square of the field strength, the sidelobes 46 have a positive value as does the primary lobe centered around location 42. Therefore, if the magnitudes of the sidelobes 46 are sufficient, the sidelobes can induce printed features in the radiation-sensitive material 38. FIG. 7 illustrates the additive effect of a sidelobe formed from radiation centered around location 42 and a sidelobe formed from radiation centered around location 44. The radiation formed around location 44 is consistent in magnitude with that formed around location 42. Accordingly, since the adjacent sidelobes overlap, the two sidelobes combine to form a resultant overlapping lobe 52. Lobe 52 results from the combination of overlapping sidelobes of adjacent patterns of radiation. Such an overlapping combination, as illustrated in FIG. 7, can be extended to combinations of 3, 4 or more proximate patterns of radiation. Accordingly, the energy combination of adjacent overlapping sidelobes can grow significantly in intensity relative to the main lobes, which can eventually result in a generated printed feature.

Figure 8:
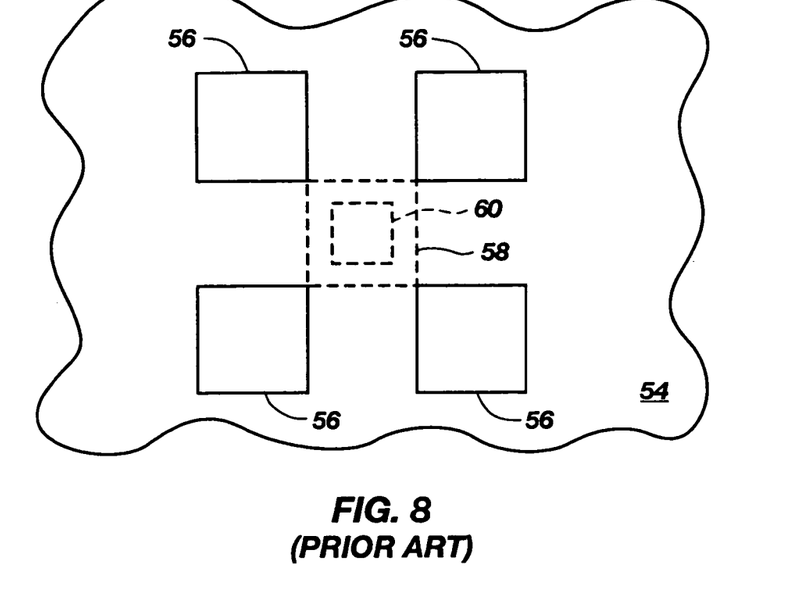
FIG. 8 is an illustration of a prior art process for determining a location of sidelobe inhibitors.

Identification of locations where sidelobes may combine to form a printed feature has been undertaken and, when such locations are identified, a radiation-patterning tool can be modified to prevent the undesired combination of sidelobes. FIG. 8 illustrates an arrangement 54 that identifies design elements illustrated as design features 56 corresponding to elements 36 (FIG. 4) of a radiation-patterning tool. One prior approach for identifying locations includes a mathematical calculation performed on the spatial characteristics of design features 56 to create a common region 58 extending between design features 56. From the region 58, a sidelobe inhibitor 60 may be calculated. The sidelobe inhibitor is utilized to prevent formation of an undesired printed feature from occurring at the location where sidelobes converge.

Figure 9:
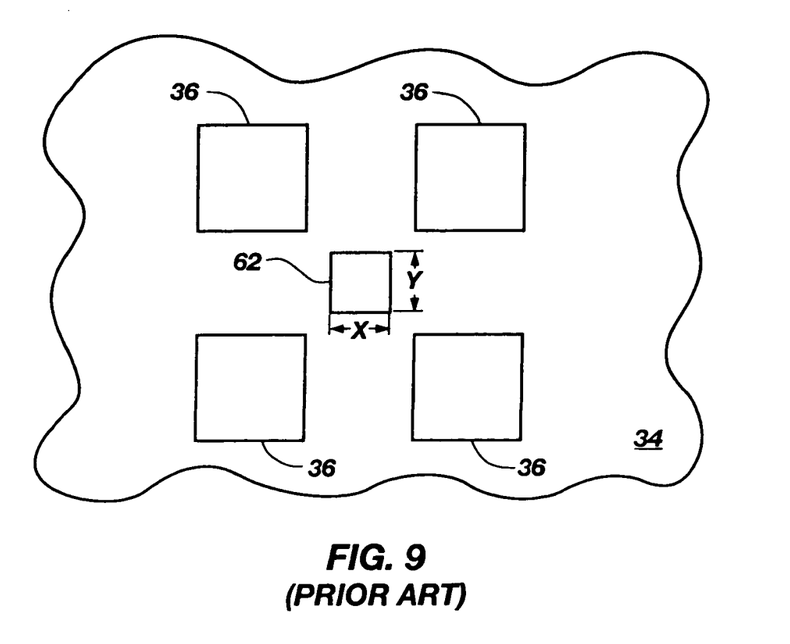
FIG. 9 is a top view of a prior art radiation-patterning tool comprising a sidelobe inhibitor.

FIG. 9 illustrates a portion of a prior art radiation-patterning tool 34 similar to the tool described with reference to FIG. 4, except that FIG. 9 further illustrates a sidelobe inhibitor 62 for preventing sidelobes of radiation from combining when passing through elements 36. Sidelobe inhibitor 62 typically includes dimensions of approximately one-half of the wavelength of the radiation passed through radiation-patterning tool 34. Sidelobe inhibitor 62 may be formed, for example, by etching onto an opaque material associated with radiation-patterning tool 34 to form a region where radiation will be in phase with the main energy lobe and thus out of phase relative to other portions of the sidelobe radiation. Such a combination is typically known as destructive interference, which results in a cancellation of a significant amount of intensity from the combined sidelobes.

Accordingly, there is a need and desire to minimize and even eliminate sidelobe effects on a radiation-patterning process.

BRIEF SUMMARY OF THE INVENTION

A method and system for sidelobe suppression in a radiation-patterning tool is provided. In one embodiment of the present invention, a method for mitigating sidelobe artifacts in radiation-patterning process is described. Elements to be formed in a radiation-patterning tool are defined as a function of the radiation wavelength, which creates a desired pattern along with resultant sidelobes. Diffraction rings are calculated about each of the elements to identify where sidelobe interference zones and intersections of diffraction rings are located. Sidelobe inhibitors are located at the identified locations.

In another embodiment of the present invention, a method of generating sidelobe inhibitors on a radiation-patterning tool is described. Elements for forming in the radiation-patterning tool are defined with a mathematical definition of the spatial orientations formed. Diffraction rings about each of the elements are further defined with intersections of adjacent diffraction rings identified as prospective locations for the placement of sidelobe inhibitors.

In yet another embodiment of the present invention, a method for designing a mask for illuminating a pattern defines elements to be formed in a mask. Diffraction rings about each of the elements that coincide with the locations of sidelobes about the elements are calculated. Sidelobe inhibitors are formed at intersections of the diffraction rings of adjacent elements.

In yet a further embodiment of the present invention, a mask for exposing a resist-covered wafer in a radiation-patterning process includes transmissive elements corresponding to features on the wafer that are to be exposed and one or more sidelobe inhibitors to suppress radiation sidelobes with the sidelobe inhibitors arranged at intersections of the diffraction rings.

A computer-readable media embodiment of the present invention is also provided for determining the placement of sidelobe inhibitors relative to elements to be formed on a radiation-patterning tool. Diffraction rings are calculated to coincide with an approximate location of radiation sidelobes, with the intersection of overlapping diffraction rings identified as locations for placement of sidelobe inhibitors.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention provides a method and algorithm for enabling the placement of sidelobe inhibitors using a geometrical approach for identifying the interaction or convergence of sidelobes of two or more desired patterns. The methodology of the present invention may be used to account for two or more interactions between contacts in a radiation-patterning tool design. Prior approaches could not address two or more contact interactions but rather placed an inhibitor at a midpoint between the windows or elements rather than at each of the overlapping locations. The present approach enables the placement of sidelobe inhibitors at multiple interaction areas of interacting contacts. The methodology of the present invention identifies interactions between two or more patterning elements and identifies locations for the addition of sidelobe inhibitors for suppressing undesired sidelobe interactions. When multiple sidelobe inhibitors occur in an undesirable proximity, then a common sidelobe inhibitor may be identified and placed in a common location.

Figure 10:
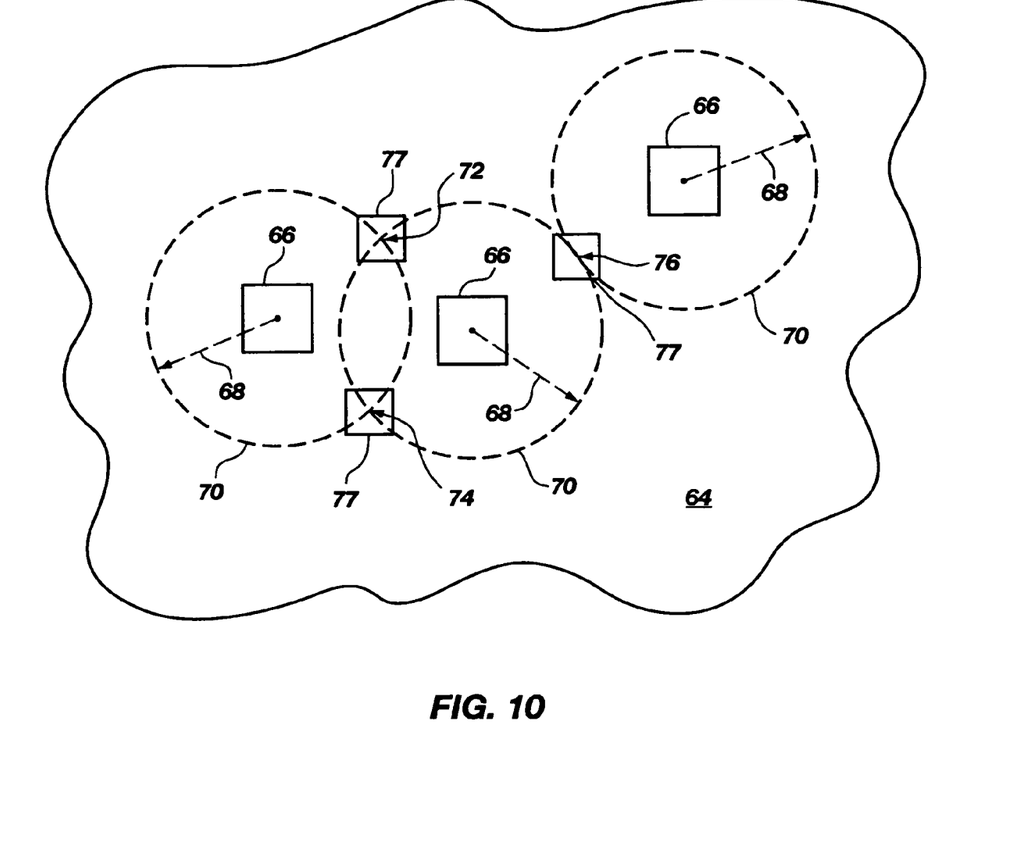
FIG. 10 is a top view of a mathematical construct illustrating a process for determining locations of sidelobe inhibitors, in accordance with an embodiment of the present invention.

FIG. 10 illustrates a geometric method for mitigating sidelobe artifacts in a radiation-patterning process, in accordance with an embodiment of the present invention. The present method generates a mathematical method or construct 64 that includes design features 66. One methodology of the present invention determines which features 66 are adjacent to other features 66 and within a threshold spatial distance of one another. Design features 66 ultimately correspond to elements of a radiation-patterning tool that may be used for printing one or more patterns on a radiation-sensitive material. As interference is a function of the additive effects of radiation, a zone or ring is defined by a radius around each feature where other adjacent radiation could pose an additive effect. The threshold spatial distance utilized in identifying design features in the present methodology is about eight-tenths of the wavelength divided by the numerical aperture.

An algorithm used to generate a radius circumscribing the design feature is computed by calculating a radius 68 and forming corresponding diffraction rings 70 around each design element. It should be appreciated that the diffraction rings do not extend between actual elements of a radiation-patterning tool but rather circumscribe design features corresponding to a mathematical construct for calculating the sidelobe convergences. Once diffraction rings 70 have been identified, locations that may be susceptible to sidelobe convergence or overlap are identified. Sidelobe convergence or overlap occurs at locations where one diffraction ring from one design feature intersects a second diffraction ring of a second design feature. Locations 72, 74 and 76 identify intersections of the respective diffraction rings 70. These intersecting locations identify regions where electric-field energy of radiation sidelobes may become additive or converge, resulting in corresponding areas that may be susceptible to inadvertent patterning.

Figure 11:
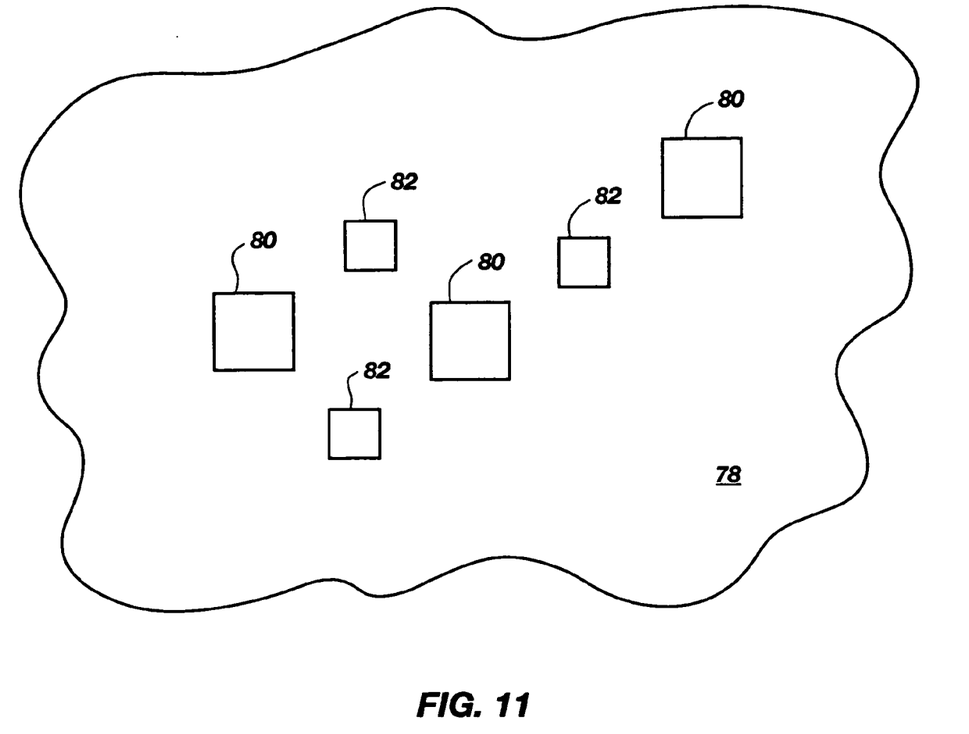
FIG. 11 is a diagrammatic top view of a radiation-patterning tool comprising sidelobe inhibitors, in accordance with an embodiment of the present invention.

The mathematical construct 64 illustrates design features 66 that may be closer to one another than others of the design features, resulting in multiple potential sidelobe interaction locations, namely locations 72 and 74, which would not typically be discerned through other prior art techniques. After the sidelobe overlap regions are located within mathematical construct 64, the construct is utilized to form a radiation-patterning tool. Such radiation-patterning tool comprises elements corresponding to design features 66 and also comprises the mathematical sidelobe inhibitors 77 (e.g., phasing regions) formed across at least some of the regions of the tool corresponding to the identified sidelobe overlap locations. FIG. 11 illustrates the conversion of the design features and corresponding sidelobe inhibitors from a modeling or construct domain into a real or radiation-patterning tool domain illustrated as the radiation-patterning tool 78. In FIG. 11, radiation passing through windows or elements 80 may result in undesirably exposed locations that were calculated and are protected by the addition of sidelobe inhibitors 82. The dimensions of sidelobe inhibitors 82 will typically be about one half of the wavelength of radiation passed through radiation-patterning tool 78. Sidelobe inhibitors 82 may be formed by etching an opaque material associated with radiation-patterning tool 78 to form regions where radiation will be in phase with the main lobe and, thus, out of phase relative to other portions of the sidelobe radiation. Such destructive interference assists in the cancellation of a significant amount of intensity from the combined sidelobes.

Figure 12:
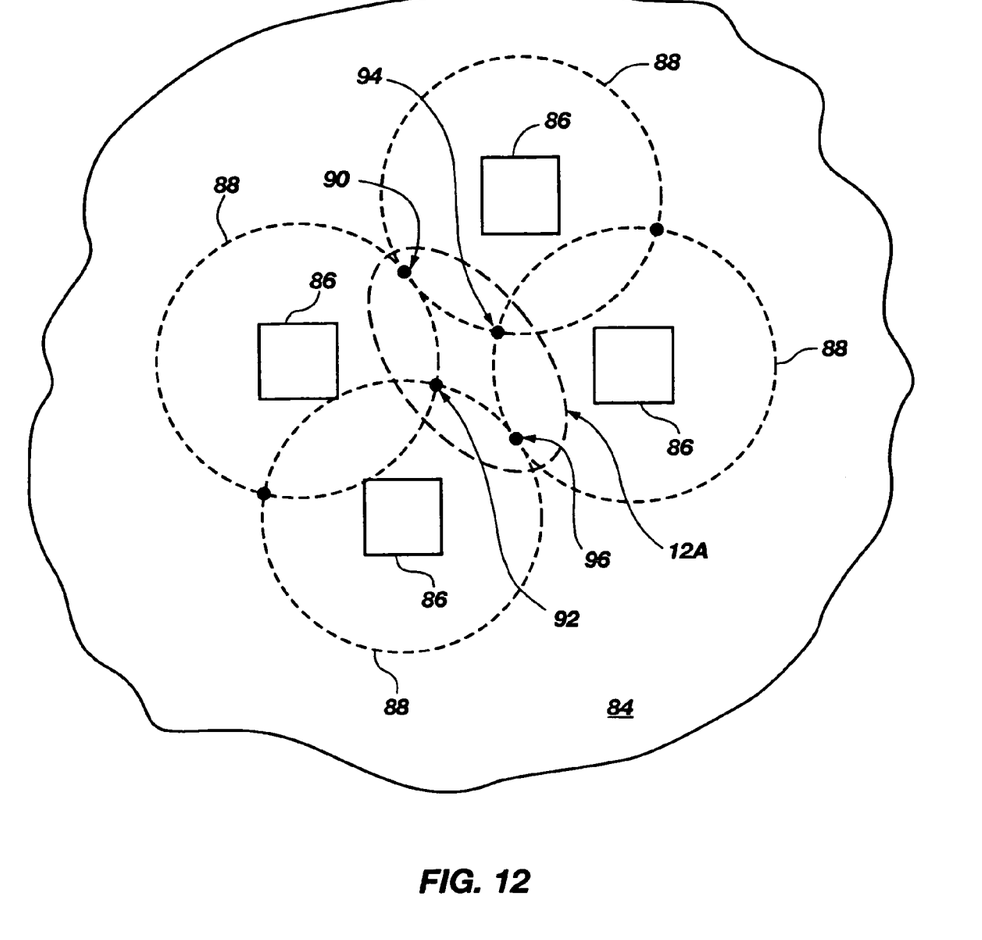
FIG. 12 is a diagrammatic top view of a mathematical construct illustrating a process for determining a location of a sidelobe inhibitor, in accordance with an embodiment of the present invention.
Figure 13:
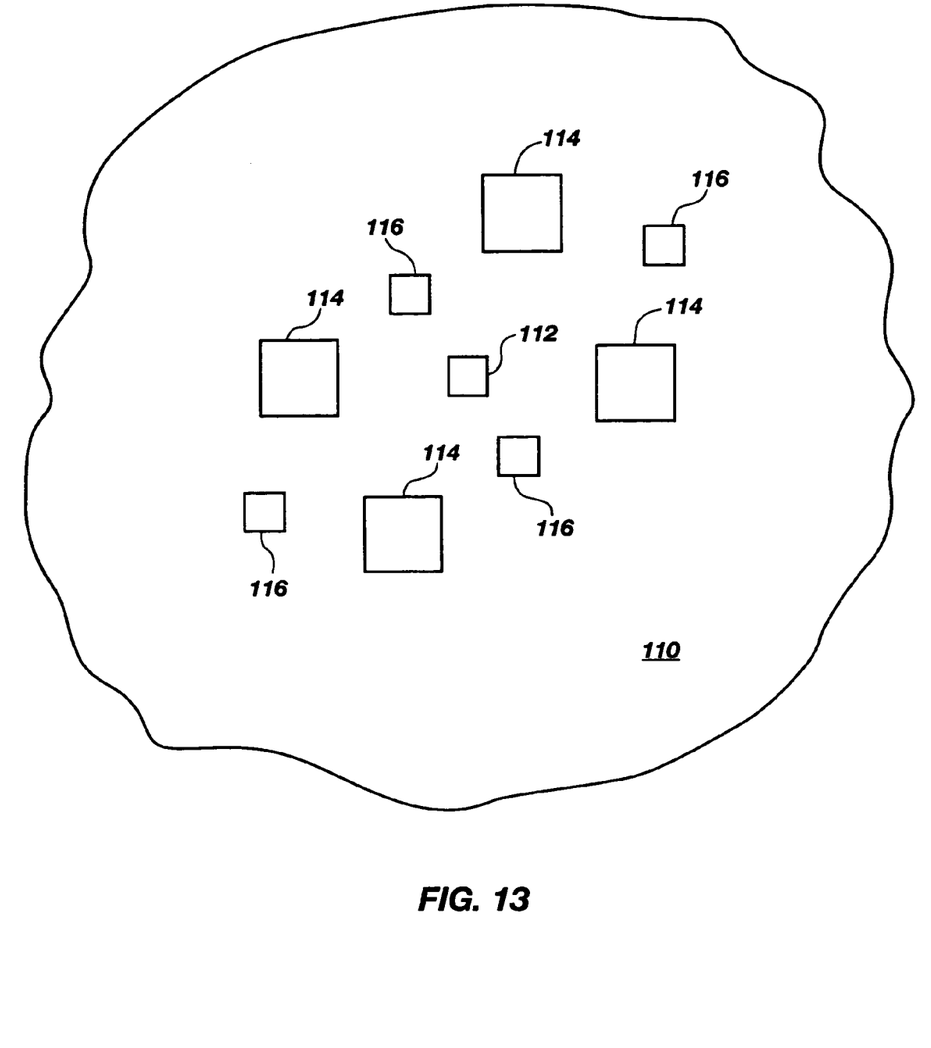
FIG. 13 is a diagrammatic top view of a radiation-patterning tool comprising sidelobe inhibitors, in accordance with an embodiment of the present invention.

FIGS. 12 and 13 illustrate further methods for determining locations of sidelobe interaction and, ultimately, locations for placement for sidelobe inhibitors on a radiation-patterning tool. FIG. 12 illustrates a mathematical construct 84 having design features 86. Respective diffraction rings 88 are generated about each of the design features 86 for a determination of convergence of sidelobe energies. As illustrated, intersections of diffraction rings 88 identify locations 90, 92, 94 and 96 that represent potential sidelobe convergence locations. In FIG. 12, convergence locations 90 and 96 are located an appreciable distance from any others of the sidelobe convergence locations. However, sidelobe convergence locations 92 and 94 are relatively adjacent to one another and, according to the previously disclosed embodiment with regard to FIGS. 10 and 11, sidelobe inhibitors would be placed at both regions about locations 92 and 94, resulting in sidelobe inhibitors that encroach or nearly touch one another. Placement of sidelobe inhibitors in close proximity to one another may present design verification issues as well as mitigate the benefits associated with sidelobe inhibitors. Accordingly, an exemplary embodiment of the present invention contemplates a methodology and algorithm for determining when a plurality of sidelobe convergence locations is preferably substituted with a lesser number of locations for better facilitating any verification and/or sidelobe convergence suppression benefits.

Figure 12A:
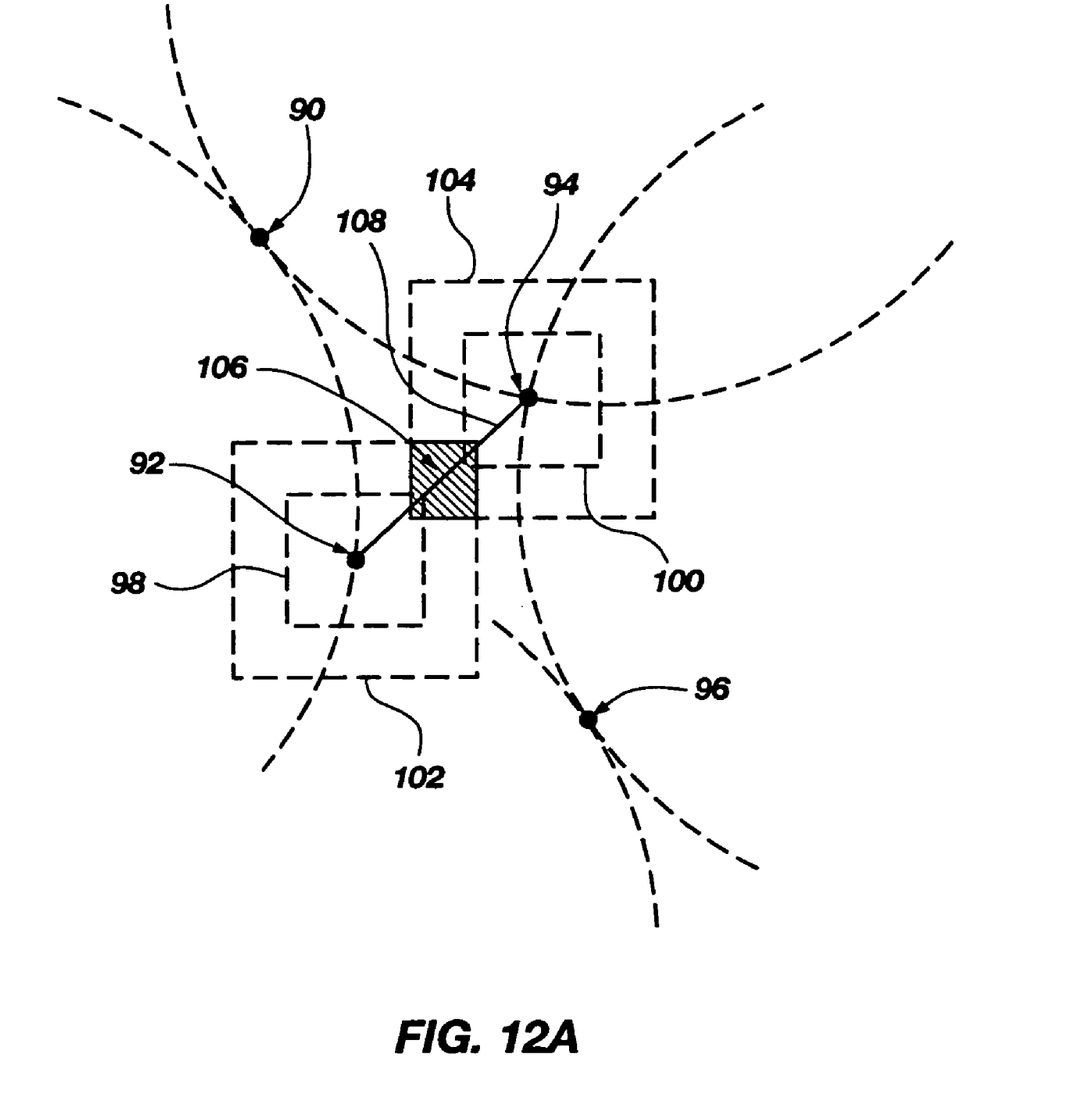
FIG. 12A is an enlarged view of a sidelobe convergence location illustrated in FIG. 12.

FIG. 12A illustrates an enlarged view of the sidelobe convergence locations 90, 92, 94 and 96 of FIG. 12. As described above, placement of two or more sidelobe inhibitors in close proximity to one another may present undesirable results from a design verification approach or from actual minimization of the sidelobe-inhibiting effects. One method for determining the existence of these proximity concerns is illustrated in FIG. 12A, wherein features 98 and 100 are centered about locations 92 and 94, respectively. When a feature overlaps with another feature, then a common feature may be identified and placed either central or in another intermediate location as a common sidelobe inhibitor. Additionally, as illustrated in FIG. 12A, extensions or guard rings 102, 104 may be placed around features 98, 100 for use in analyzing any overlapping or common areas as a result of proximity of the features. In the present illustration, a common or overlapping area 106 is identified and, in the present embodiment, results in the definition of a resulting common sidelobe inhibitor. The placement of the common sidelobe inhibitor may be calculated, in one embodiment, by forming a line 108 between locations 92, 94 and placing the common feature either centered or in another weighted manner along the resulting line 108.

FIG. 13 illustrates the formation of a radiation-patterning tool from the mathematical construct of FIGS. 12 and 12A. After the sidelobe overlap regions are located within construct 84 (FIGS. 12 and 12A), the construct is utilized to form a radiation-patterning tool 110. Such radiation-patterning tool 110 comprises elements corresponding to design features 86 and also comprises the sidelobe inhibitors (e.g., phasing regions) formed across at least some of the regions of the tool corresponding to the identified sidelobe overlap locations. In the present embodiment, it is desirable to identify adjacent sidelobe inhibitors that are proximately undesirable. FIG. 13 illustrates the conversion of the design features and corresponding sidelobe inhibitors from a modeling or construct domain into a real or radiation-patterning tool domain illustrated as the radiation-patterning tool 110. Tool 110 includes windows or elements 114 with sidelobe inhibitors 116 identified according to the overlap procedures previously described. The calculation of a common sidelobe inhibitor 112 results from the proximate location procedure of FIGS. 12 and 12A. The dimensions of sidelobe inhibitors 112 and 116 are typically about one-half of the wavelength of radiation passed through radiation-patterning tool 110. Sidelobe inhibitors 112 and 116 can be formed by etching an opaque material associated with radiation-patterning tool 110 to form regions where radiation will be in phase with the main lobe and thus out of phase relative to other portions of the sidelobe radiation. Such destructive interference assists in the cancellation of a significant amount of intensity from the combined sidelobes.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A mask for exposing a resist-covered wafer in a radiation-patterning process, comprising:

transmissive elements corresponding to features on the wafer to be exposed, the elements formed as a function of a wavelength of radiation to be used for exposing; and common sidelobe inhibitors to suppress sidelobes of the wavelength of radiation, the common sidelobe inhibitors arranged at common locations determined from intersections of diffraction rings wherein each of the diffraction rings is around a different one of the elements, the intersections defining locations for sidelobe inhibitors having guard rings thereabout wherein overlapping guard rings define overlap regions each having one of the common locations defined therein, the common sidelobe inhibitors further configured to pass radiation in phase with radiation passing through the transmissive elements.

2. The mask of claim 1, wherein the diffraction rings each have a radius that is about eight-tenths of the wavelength of radiation, divided by a numerical aperture.

3. The mask of claim 1, wherein the common sidelobe inhibitors have side dimensions of about one-half of the wavelength of the radiation.

4. A mask for exposing a resist-covered wafer in a radiation-patterning process, comprising:

transmissive elements corresponding to features on the wafer to be exposed; and a common sidelobe inhibitor to suppress sidelobes of a wavelength of radiation, the common sidelobe inhibitor formed around a common location in an overlap region resulting from an overlap of guard rings that are each around one of two or prospective sidelobe inhibitors identified by intersections of diffraction rings around wherein each of the diffraction rings is a different one of the elements.

5. The mask of claim 4, wherein a radius of each of the diffraction rings is about eight-tenths of the wavelength of radiation, divided by a numerical aperture.

6. The mask of claim 4, wherein the common sidelobe inhibitor has side dimensions of about one-half of the wavelength of the radiation.

7. A mask for a radiation-patterning process, comprising:
elements corresponding to features to be exposed; and
a common sidelobe inhibitor to suppress sidelobes of the radiation, the common sidelobe inhibitor formed at a common location in lieu of a plurality of sidelobe inhibitors at separat locations, each of the plurality of sidelobe inhibitors a overlapping guard rings therearound, wherein the guard rings would have been overlapping at the common location, and wherein the common sidelobe inhibitor is further configured to pass radiation in phase with radiation passing through the elements.

8. The mask of claim 7, wherein the plurality of sidelobe inhibitors are identified by intersections of diffraction rings around the elements.

9. The mask of claim 8, wherein a radius of each of the diffraction rings is about eight-tenths of the wavelength of radiation, divided by a numerical aperture.

10. The mask of claim 7, wherein the common sidelobe inhibitor has side dimensions of about one-half of the wavelength of the radiation.

* * * * *

UNITED STATES PATENT AND TRADEMARK OFFICE
CERTIFICATE OF CORRECTION

PATENT NO. : 7,273,684 B2  Page 1 of 2
APPLICATION NO. : 11/336229
DATED : September 25, 2007
INVENTOR(S) : Stanton et al.

It is certified that error appears in the above-identified patent and that said Letters Patent is hereby corrected as shown below:

On the title page, item (57), under "Abstract", in column 2, line 6, delete "rings" and insert -- ring --, therefor.

On the title page, item (57), under "Abstract", in column 2, line 9, delete "Sidelobe" and insert -- would otherwise overlap with a guard ring around another one of the intersections, a common sidelobe --, therefor.

On the title page, item (57), under "Abstract", in column 2, line 10, after "at the" delete "a common sidelobe".

In column 8, line 43, in Claim 1, after "rings" insert -- , --.

In column 8, line 46, in Claim 1, after "inhibitors" insert -- each --.

In column 8, line 46, in Claim 1, after "having" insert -- a --.

In column 8, line 46, in Claim 1, delete "rings thereabout" and insert -- ring therearound --, therefor.

In column 8, line 67, in Claim 4, after "two" delete "or".

In column 9, line 1, in Claim 4, after "rings" delete "around" and insert -- , --, therefor.

In column 9, line 2, in Claim 4, after "is" insert -- around --.

In column 9, line 15, in Claim 7, delete "separat" and insert -- separate --, therefor.

In column 9, line 16, in Claim 7, delete "a overlapping" and insert -- including a --, therefor.

UNITED STATES PATENT AND TRADEMARK OFFICE
CERTIFICATE OF CORRECTION

PATENT NO. : 7,273,684 B2
APPLICATION NO. : 11/336229
DATED : September 25, 2007
INVENTOR(S) : Stanton et al.

It is certified that error appears in the above-identified patent and that said Letters Patent is hereby corrected as shown below:

In column 9, line 16, in Claim 7, delete "rings" and insert -- ring --, therefor.

Signed and Sealed this

Eleventh Day of December, 2007

JON W. DUDAS
*Director of the United States Patent and Trademark Office*